Oct. 5, 1965 J. R. COX ETAL 3,210,672

LOW FREQUENCY DIFFERENCE AMPLIFIER UTILIZING
ELECTROCHEMICAL INTEGRATING DEVICE

Filed May 16, 1962 2 Sheets-Sheet 1

INVENTOR.
JAMES R. COX
JERRY D. MERRYMAN

BY

INVENTOR
JAMES R. COX
JERRY D. MERRYMAN
BY
Giles C. Clegg

United States Patent Office 3,210,672

Patented Oct. 5, 1965

3,210,672

LOW FREQUENCY DIFFERENCE AMPLIFIER UTILIZING ELECTROCHEMICAL INTEGRATING DEVICE

James R. Cox, Richardson, and Jerry D. Merryman, Dallas, Tex., assignors, by mesne assignments, to Self-Organizing Systems, Inc., Dallas, Tex., a corporation of Texas Filed May 16, 1962, Ser. No. 195,109
8 Claims. (Cl. 330—3)

The present invention relates to low frequency signal amplifiers and more particularly to a low frequency signal amplifier that utilizes an electro-chemical device as the active elements.

A family of electro-chemical devices in which a number of different effects are achieved by the movement of ions in solution has attracted favorable attention in recent years. These devices are commonly referred to by the acronym "solions." They are discussed in some detail in the literature: Journal of Electro-Chemical Society, volume 104, No. 12 (December 1957); Yale Scientific Magazine, volume XXXII, No. 5 (February 1958); Electronics Product Engineering Bulletin No. 1, published November 5, 1957, by National Carbon Company, 30 East 42nd Street, New York 17, New York; and An Introduction to Solions, published February 1962, by Texas Research and Electronic Corporation, 6612 Denton Drive, Dallas, Texas.

In United States Patents Nos. 2,975,373 and 2,975,374, there are disclosed low frequency signal amplifiers which use a solion tetrode known as an "electrical readout integrator" as the essential component. The electrical readout integrator has the ability to indicate the integral of a current applied to it over a period of time, and its signal can be read electrically. An electrical readout integrator suitable for use in the amplifiers disclosed in the above patents and in the amplifier of the present invention is disclosed in the application of Nelson N. Estes, Serial No. 777,009, now Patent No. 3,021,482.

According to the present invention, a low frequency differential amplifier that utilizes electrical readout integrators as the active elements is provided. Single stage gains of several hundred are obtainable using the amplifier provided by the present invention. In addition, it is affected to a much lesser extent by changes in ambient temperature than the above referenced prior art solion amplifiers. The drift characteristics of the present amplifier have been found to compare very favorably with many chopper stabilized amplifiers.

Many objects and advantages of the present invention will become apparent as the following detailed description of the same unfolds when taken in conjunction with the appended drawings wherein like reference numerals denote like parts and in which.

Figure 1:
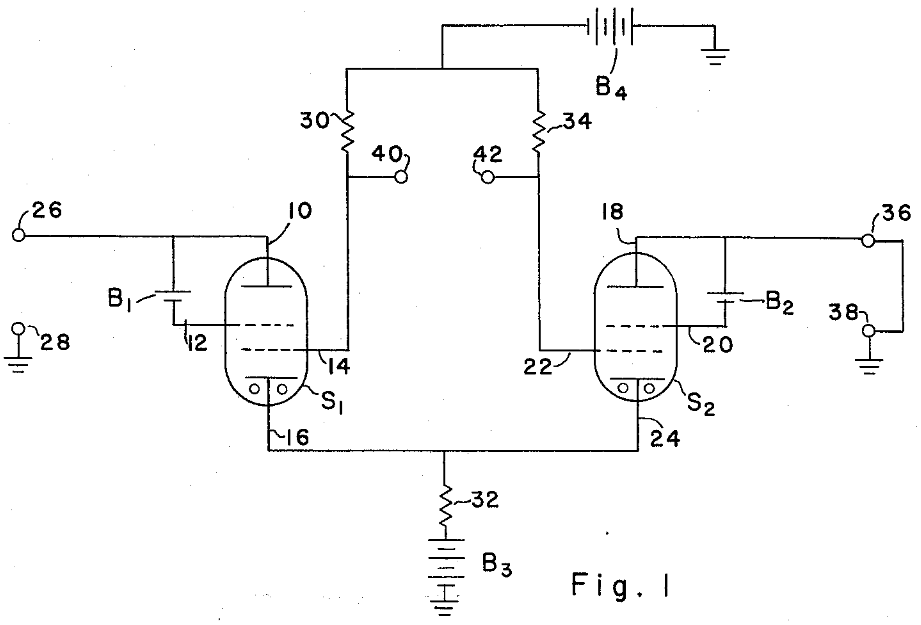
FIGURE 1 is a schematic circuit diagram illustrating the basic amplifier provided by the present invention.

As described in the above referenced United State patent application 777,009, the solion tetrode is an electrolytic cell having four electrodes that are normally referred to as the input, shield, readout and common electrodes. The performance of this device as an electrical readout integrator is well known, and may be expressed mathematically in the form:

$$I_o(t)=K\int_0^T I_i(t)\,dt \qquad (1)$$

where K is the sensitivity constant of the integrator, $I_i$ is the input current and $I_o$ is the output current.

Another property of the solion tetrode is that it develops a small potential between the input and the common electrodes called the concentration potential that is proportional to the logarithm of the readout current. If a small potential is applied to the input of a solion, an input current will flow, which will change the output current in accordance with the mathematical expression of Equation 1 until the concentration potential equals the applied potential.

The concentration potential is given by:

$$E=\frac{RT}{nF}\ln\left(\frac{I_o}{I_x}\right) \qquad (2)$$

Where $$I_x=I_{xo}[1+a(\theta-25)] \qquad (3)$$

And $E$=input voltage from common electrode to input electrode
$R$=universal gas constant=8.31 joules/mole/degree C.
$T$=absolute temperature, degrees Kelvin
$n$=valence=2
$F$=faraday constant=96,500 coulombs/equivalent
$I_o$=readout current
$I_x$=equilibrium current of a solion at any temperature $\theta$
$I_{xo}$=standard equilibrium current, measured at 25° C.
$a$=a temperature coefficient. Experimentally, $$a=+0.024/°\text{ C.}$$

$\theta$=temperature in degrees C.

Equation 2 is taken from Nernst's equation and is accurate for solid state or slowly varying conditions. Equilibrium current is defined as the output current that flows with zero voltage between the input electrode and the common electrode and the desired operating voltage applied between the readout electrode and the common electrode. The variation of equilibrium current with temperature is not exactly linear, but the approximation given in Equation 3 is sufficiently accurate for most discussions.

If the mutual conductance, $Gm$, is defined as the rate of change of readout current with respect to input voltage, Equation 2 may be differentiated to derive an equation for mutual conductance as follows:

$$\frac{1}{Gm}=\frac{\partial E}{\partial I_o}=\frac{RT}{nF}\left(\frac{I_x}{I_o}\right)\left(\frac{1}{I_x}\right) \qquad (4)$$

or $$|Gm|=\left(\frac{nF}{RT}\right)I_o \qquad (5)$$

Thus, it is seen that the mutual conductance is directly proportional to the operating current and inversely proportional to the absolute temperature. It is significant that the mutual conductance as defined by Equation 5 is not dependent upon solion geometry, concentration of the electrolyte or any other specific parameter of the solion, but rather the mutual conductance and, consequently, the gain of the amplifier is determined solely by the operating current and the temperature. Thus, the possibility exists of providing an amplifier whose gain is independent of the age or condition of the active element, provided, of course, that the solion is at all operative.

Turning now to FIGURE 1 of the drawings, the basic amplifier provided by the present invention is seen to include a pair of solion tetrodes $S_1$ and $S_2$. The solion $S_1$ includes an input electrode 10, a shield electrode 12, a readout electrode 14, and a common electrode 16. The solion $S_2$ is of the same type as the solion $S_1$ and preferably possesses substantially the same characteristics as solion $S_1$. The solion $S_2$ includes an input electrode 18, a shield electrode 20, a readout electrode 22, and a common electrode 24.

The signal to be amplified is applied to terminals 26 and 28. Terminal 28 may be grounded. Terminal 26 is connected to the input electrode 10 of solion $S_1$. A battery $B_1$ is connected between the input electrode 10 and the shield electrode 12 such that the input electrode 10 is positive with respect to shield electrode 12. It is practical for the battery $B_1$ to have an open circuit voltage of approximately 0.5 volt. The battery $B_1$ provides a potential to polarize the shield electrode 12 and prevent diffusion of ions from a reservoir region defined by the input electrode 10 and the shield electrode 12 to an integral region defined by the readout electrode 14 and the common electrode 16.

The readout electrode 14 of solion $S_1$ is connected through a load resistor 30 to the negative terminal of a battery $B_4$. The positive terminal of the battery $B_4$ is connected to ground. The common electrode 16 of the solion $S_1$ is connected through resistor 32 to the positive terminal of the battery $B_3$. The negative terminal of the battery $B_3$ is connected to ground.

The negative terminal of battery $B_4$ is also connected through load resistor 34 to the readout electrode 22 of solion $S_2$. The common electrode 24 of the solion $S_2$ is connected to the common electrode 16 of the solion $S_1$. The input electrode 18 of the solion $S_2$ is connected to the shield electrode 20 by battery $B_2$. The battery $B_2$ is similar to the battery $B_1$ and performs a like function. The input electrode 18 of the solion $S_2$ is also connected to the input terminal 36. The input terminal 36 may be shorted to input terminal 38, which is in turn connected to ground, if only one input signal is to be applied to the amplifier. If the amplifier is used to amplify the difference between the two applied signals, the second signal can be applied to terminal 36. The terminal 36 also provides a convenient means of applying feedback, as will be described in the following description of the invention.

The battery $B_3$ in conjunction with the resistor 32 functions as a constant current source that establishes the quiescent current that flows through the solions $S_1$ and $S_2$. The resistance of the resistor 32 is such as to provide the desired level of quiescent currents. Quiescent current is defined as the current flowing through the solions $S_1$ and $S_2$ in the absence of input signal, but with the constant current source connected to the common electrode. It is to be noted that the combined quiescent currents are a function of the circuit design rather than the solion characteristics.

If the potential which exists between the readout electrode 14 and the common electrode 16 exceeds approximately 0.75 volt, hydrogen gas will be evolved in an irreversible reaction causing deterioration of the solion tetrodes. As the voltage provided by the batteries $B_3$ and $B_4$ are normally much higher than 0.75 volt, a careful balance of batteries $B_3$ and $B_4$ and resistors 30, 32 and 34 is desirable to insure that the potential between the readout electrode and the common electrode of solion $S_1$ or $S_2$ does not exceed a level of approximately 0.7 volt.

In operation of the circuit shown in FIGURE 1, so long as the readout currents of the solions $S_1$ and $S_2$ are equal and the resistance of resistors 30 and 34 is equal, the output voltage that appears across the output terminals 40 and 42 will be zero. If a signal is applied to the input terminals 26 and 28, it will produce a change in the output current $I_0$ of the solion $S_1$. Since the combined readout currents of the two solions $S_1$ and $S_2$ are set by the constant current source comprised of the battery $B_3$ and the resistor 32, as the readout current of the solion $S_1$ increases the readout current of the solion $S_2$ will decrease. Thus, when a signal is applied to the input terminals an unbalanced condition is created between the readout currents of the two solions $S_1$ and $S_2$ causing a potential to appear across the output terminals. The level of the output signal will be dependent upon the voltage developed by the battery $B_4$ and the difference in the readout currents from the solions $S_1$ and $S_2$.

Although the above description has been with reference to the operation in which a signal to be amplified is applied to only one of the input terminals, it is believed evident that the amplifier can be used as a differential amplifier by applying one input signal to the input terminal 26 and another input signal to the input terminal 36. If the two input signals are of equal amplitude, the output currents of the solions $S_1$ and $S_2$ will remain equal. If the two input signals are of unequal amplitude, the output signal will be a function of the difference.

Figure 2:
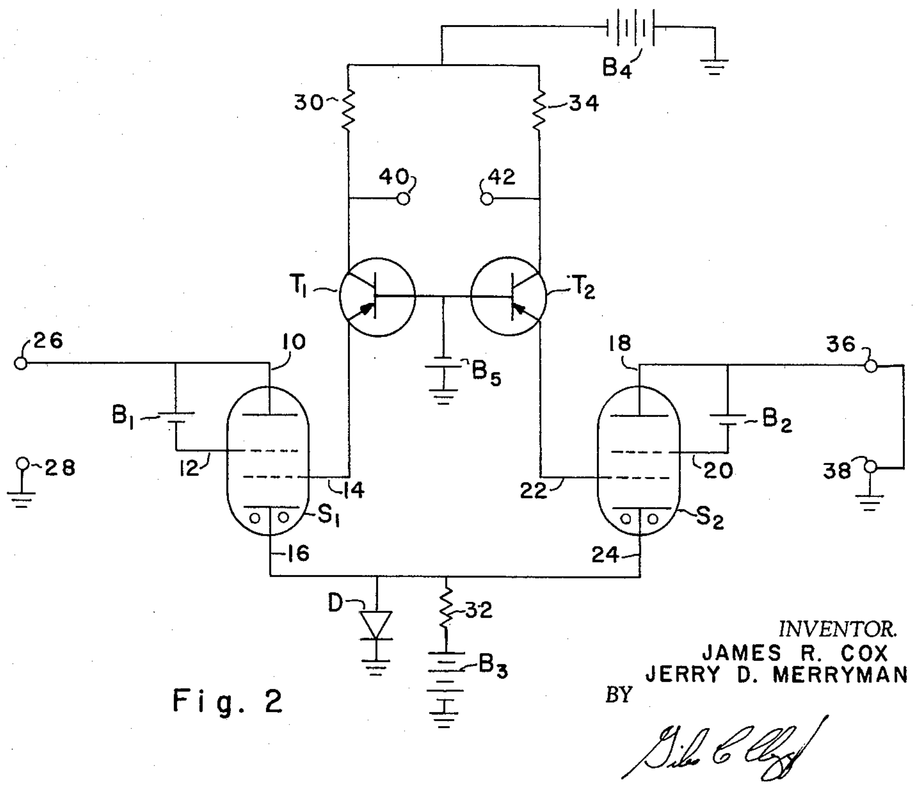
FIGURE 2 is a schematic circuit diagram illustrating the manner in which the solions used in the circuit of FIGURE 1 may be protected against excessive voltages.

As mentioned above, in utilizing the circuit of FIGURE 1 it is desirable that the voltage of batteries $B_3$ and $B_4$ and the resistances 32, 30 and 34 be carefully balanced to insure that the maximum voltage which appears between the readout electrode and the common electrode of either of the solions $S_1$ and $S_2$ does not become sufficiently high to cause appreciable amount of gas to be evolved in an irreversible reaction. FIGURE 2 illustrates the preferred manner for insuring that the voltage between the readout electrode and the common electrode of either of the solions $S_1$ or $S_2$ does not obtain an undesirably high amplitude. This very desirable voltage protection feature is achieved by connecting a transistor $T_1$ between the output terminal 40 and the readout electrode 14, a transistor $T_2$ between the output terminal 42 and the readout electrode 22 and a diode D between ground and the common electrode of solions $S_1$ and $S_2$.

The transistors $T_1$ and $T_2$ are connected as common base amplifiers with their respective bases connected together and to battery $B_5$. The emitter of each of the transistors $T_1$ and $T_2$ are connected to the readout electrodes 14 and 22 respectively. The gain of the transistors $T_1$ and $T_2$ in conjunction with the voltage of the battery $B_5$ sets the readout voltage on the solions so that the solion operating conditions are not critically related to the condition of the batteries $B_3$ and $B_4$. As the emitter of transistor $T_1$ or $T_2$ can never be more negative than the base, the maximum voltage that can appear on the readout electrode will always be somewhat less than the voltage of the battery $B_5$.

It is preferred that the potential applied to the bases of transistors $T_1$ and $T_2$ be in the order of 0.5 volt, allowing the maximum voltage between ground and the readout electrode of solions $S_1$ and $S_2$ to only be in the order of 0.3 volt. During normal operation, the common electrode of solions $S_1$ and $S_2$ will be only a few millivolts above ground potential. However, when power is first applied to the amplifier and before the currents flowing through the solion stabilize, the common electrode may be as much as a volt above ground causing damage to the solions. The diode D is a conventional silicon diode having a forward voltage drop of approximately 0.3 volt. The diode D will, therefore, conduct when the potential on common electrodes becomes approximately 0.3 volt and prevents a further increase in potential on the common electrode. The maximum voltage that can exist between the common electrode and the readout electrode of either solion will only be in the order of 0.6 volt, insuring that the solions will not be damaged due to an excessive potential difference between the common and readout electrodes.

The gain of the amplifier provided by the present invention can be expressed mathematically as:

$$\text{Gain} = GmR_L \qquad (6)$$

Equation 6 is accurate provided the load resistance is much smaller than the output impedance of the solion.

The input impedance to the emitters of the transistors $T_1$ and $T_2$ will be very low (in the order of 40 ohms or less) if transistors $T_1$ and $T_2$ are characterized by having a high gain. In addition, the connection of the transistors $T_1$ and $T_2$ as shown also provides a very high output impedance in the order of 1 megohm or more to the load resistors 30 and 34. Thus, the gain equation, Equation 6, will be accurate for the circuit of FIGURE 2.

It is also very desirable that with zero input the output be zero and that an apparent output signal not appear in the absence of input signal as a result of changes in temperature.

Figure 3:
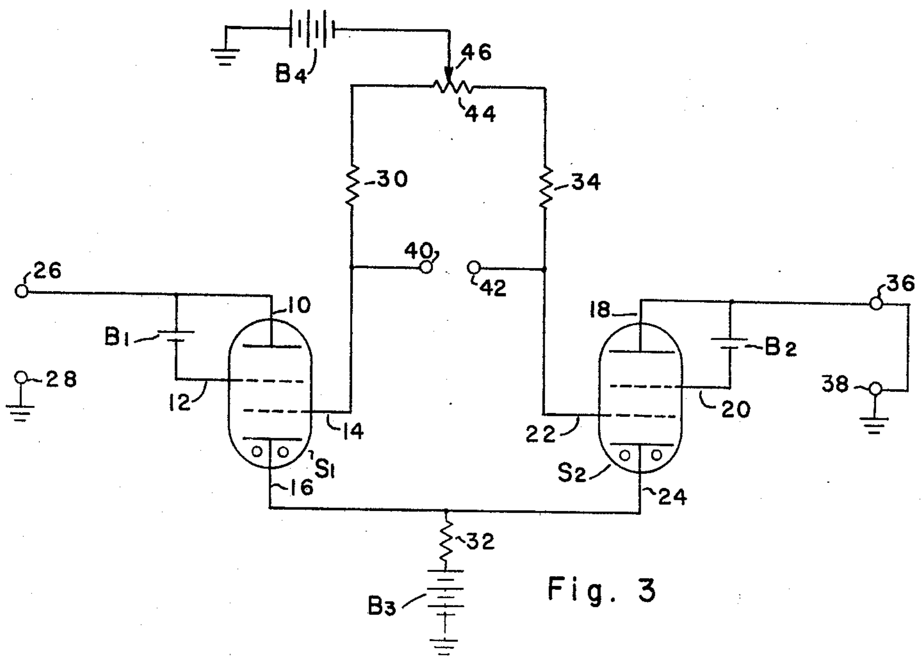
FIGURE 3 is a schematic circuit diagram illustrating the preferred method for obtaining zero output signal for zero input signal.

The preferred method for obtaining zero adjustment of the quiescent currents flowing through the devices $S_1$ and $S_2$ is shown in FIGURE 3. As illustrated in FIGURE 3, zero adjustment is preferably attained by connecting a variable resistor 44 between the load resistors 30 and 34, with the tap 46 of the variable resistor being connected to the negative terminal of the battery $B_4$. The tap 46 is adjusted until the output is zero for zero input.

Zero adjustment can also be made by applying an input signal to one of the input electrodes or one of the common electrodes. However, the method illustrated in FIGURE 3 is preferred as it will not be affected by changes in quiescent currents or temperature.

This can be shown mathematically as differentiation of Equation 2 with respect to temperature yields:

$$\frac{\partial E}{\partial T}\bigg|_{I_o\ \text{constant}}=\frac{RT}{nF}\left(\frac{1}{I_x}\right)\left(\frac{\partial I_x}{\partial T}\right)-\frac{R}{nF}\ln\left(\frac{I_o}{I_x}\right) \quad (7)$$

but:

$$\frac{\partial I_x}{\partial T}=\frac{\partial I_x}{\partial \theta}=aI_{xo} \quad (8)$$

then:

$$\frac{\partial E}{\partial T}=\frac{RT}{nF}\left[\frac{a}{1+a(\theta-25)]}-\frac{R}{nF}\ln\frac{I_o}{I_x} \quad (9)$$

Thus, the input temperature coefficient of the solion is a function of both temperature and the operating point. For $\theta=25°$ C., the value of the first term in Equation 9 is 310 microvolts/° C. and the second term is zero, if the solion is operated at its equilibrium current. Since the two solions $S_1$ and $S_2$ will each be at the same temperature $\theta$, the first two terms of Equation 9 will cancel, but the second terms will cancel only if the two solions have quiescent currents in the same proportion as their equilibrium currents. Reference to Equation 9 reveals that the temperature coefficient of input drift will be zero if the zero adjustment circuit of FIGURE 3 is used as the two quiescent currents will be unequal in the same ratio as the equilibrium currents are unequal since the input voltages are equal.

Figure 4:
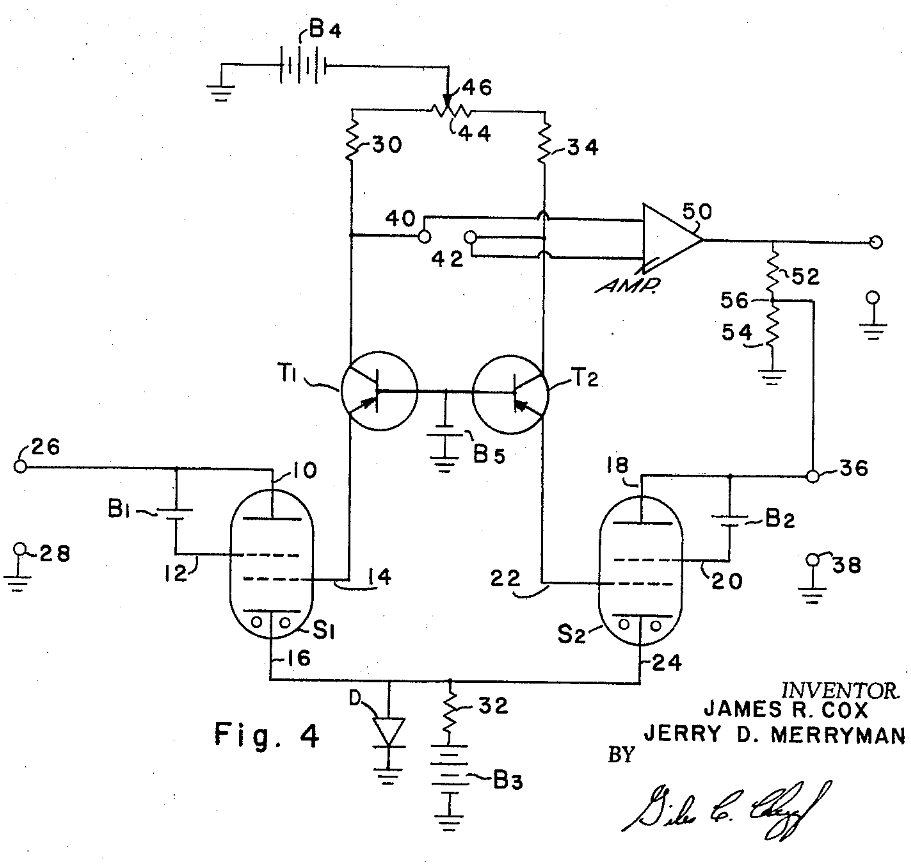
FIGURE 4 is a schematic circuit diagram illustrating the use of the solion amplifier provided by the present invention in conjunction with a conventional amplifier to provide a dual stage amplifier that is suitable for instrumentation work.

FIGURE 4 illustrates a practical type of instrument amplifier utilizing the solion amplifier provided by the present invention. According to one specific example of the amplifier shown in FIGURE 4, the solions $S_1$ and $S_2$ were each type SE–110 solions sold by Texas Research and Electronic Corporation of Dallas, Texas. The batteries $B_1$ and $B_2$ were each of 0.5 volt and the batteries $B_3$ and $B_4$ were each of 9.8 volts. The transistors $T_1$ and $T_2$ were type 2N–2189 and possessed a current gain of approximately 0.98. As connected, the input impedance of the transistors was 40 ohms and their output impedance was in excess of 1 megohm. The resistor 32 had a resistance of 8,2000 ohms and resistors 30 and 34 each had a resistance of 10,000 ohms. The variable resistor 44 was variable over a range from 0 to 2,000 ohms. The battery $B_5$ provided a voltage of 0.5 volt insuring that the maximum voltage between the readout electrodes 14 and 22 with respect to the common electrodes 16 and 24 respectively of the solions $S_1$ and $S_2$ was considerably less than that that would cause appreciable release of hydrogen gas. The output terminals 40 and 42 were connected to differential amplifier 50. The differential amplifier 50 included two stages and was terminated as a single ended amplifier. A pair of resistors 52 and 54 connected in series across the output of the amplifier 50 functioned as a voltage divider network to provide a source of feed back voltage to the solion amplifier. The resistor 52 had a resistance of 270,000 ohms and the resistor 54 had a resistance of 100 ohms. The gain of the symmetrical solion amplifier was approximately 500 and the gain of the amplifier 50 was approximately 2,000 giving an open loop gain to the system of approximaely 1,000,000. The junction point 56 between the resistors 52 and 54 was connected to the input terminal 36 of the solion $S_2$ to provide a high degree of negative feed back to the solion amplifier.

The performance data for the amplifier described above with reference to FIGURE 4 was as follows:

Gain: 2700 (voltage).

Frequency response: 0–3 c.p.s.

Transient response: For 1 millivolt step input, output is 2.7 volt step with rise time of 0.2 second, overshoot of 5%.

Noise: Equivalent input noise is about 3 microvolts R.M.S. over 5 c.p.s. bandwidth.

Zero drift: Unit stayed within ±10 microvolts of original zero at room temperature during a nine day test.

Temperature coefficient of input voltage: About 1 microvolt/° C.

Spurious input current: Order of $10^{-9}$ amp.

Input impedance: Approximately 2K ohm in series with 100 microfarads.

It is observed that the above operating characteristics are substantially as good as most chopper stabilized amplifiers and much improved over standard transistor or vacuum tube amplifiers. By virtue of the large amount of feed back, any tendency of the amplifier 50 to exhibit drift due to change in ambient temperatures is minimized making it unnecessary to resort to complication temperature compensating circuits or provision of artificial ambience in which temperatures are maintained very constant. Thus, a transistorized amplifier can be used for the amplifier 50 even though the temperature characteristics of the transistorized amplifier are very poor as the overall amplifier characteristics will be those of the input stage due to the large amount of negative feed back provided.

Many changes and modifications in the invention will be obvious to those skilled in the art in view of the above description. The invention is to be limited not to what is shown or described herein but only as necessitated by the scope of the appended claims.

What we claim is:

1. A low frequency amplifier that comprises a first electro-chemical integrating device and a second electro-chemical integrating device, each of said devices having an input electrode, a readout electrode and a common electrode, means connecting the common electrodes of said first device and said second device to a constant current source, means connected to the readout electrodes of said first device and said second device for producing at a pair of output terminals a voltage proportional to the change in readout current of each device produced responsive to the presence of an input signal at the input electrode of one of the devices and means connected to at least one of the readout electrode and the common electrode of each of said electro-chemical devices for establishing a maximum potential between ground and an electrode connected to said last mentioned means.

2. A low frequency amplifier that comprises a first electro-chemical intergating device, a second electro-chemical integrating device, each of said devices having an input electrode, a readout electrode and a common electrode, means connecting a constant current source to the common electrode of said first device and the common electrode of said second device to maintain the total current flowing through the said first device and said second device substantially constant, means connected to the readout electrode of said first device and said second device for producing at a pair of output terminals a voltage proportional to the differential change in the readout currents of said first device and said second device produced responsive to the presence of a difference in the signals applied to the input electrode of said first device and the signal applied to the input electrode of said second device and means connected to at least one of the readout electrode and the common electrode of each of said electro-chemical devices for establishing a maximum potential between ground and an electrode connected to said last mentioned means.

3. A low frequency amplifier that comprises a first electro-chemical integrating device having an input electrode, a readout electrode, and a common electrode, a second electro-chemical integrating device having an input electrode, a readout electrode, and a common electrode, a constant current source, means connecting said constant current source to the common electrode of said first device and the common electrode of said second device whereby the total current flowing through the readout electrodes of said first device and said second device remain substantially constant, a first load resistor connected in series with the readout electrode of said first device, a second load resistor connected in series with the readout electrode of said second device, a constant voltage source, means connecting said first load resistor and said second load resistor to said constant voltage source, two output terminals, each of said output terminals being connected to the low potential terminal of one of said load resistors and means connected to at least one of the readout electrode and the common electrode of each of said electro-chemical devices for establishing a maximum potential between ground and an electrode connected to said last mentioned means.

4. A low frequency amplifier as defined in claim 3 further including means for varying the ratio of the resistances of said first load resistor and said second load resistor to obtain zero output signal when the input signal is zero.

5. A low frequency amplifier as defined in claim 3 wherein said means to establish includes a first transistor having an emitter, a collector and a base, means connecting said first transistor as a common base amplifier with the emitter of said first transistor connected to the readout electrode of said first electro-chemical integrating device and the collector of said transistor connected to said first load resistor, a second transistor having an emitter, a collector and a base, means connecting said second transistor as a common base amplifier with the emitter of said second transistor connected to the readout electrode of said second electro-chemical integrating device, means connecting the collector of said second transistor to said second load resistor, and voltage supply means connected to the base of said first transistor and the base of said second transistor whereby the maximum potential appearing at the readout electrodes of said first electro-chemical integrating device and said second electro-chemical integrating device is less than the potential of said voltage supply means.

6. A low frequency amplifier as defined in claim 5 wherein said means to establish further includes a diode connected between ground and the common electrodes of said electro-chemical integrating devices whereby the maximum potential appearing at said common electrodes is the forward voltage drop of said diode.

7. In a circuit utilizing an electro-chemical integrating device having an input electrode, a common electrode and a readout electrode wherein the device is damaged if the potential between said readout electrode and common electrode exceeds a predetermined value, and wherein said readout electrode connects to a juncture point, the improvement comprising a transistor having a base, collector and emitter electrodes, means connecting said transistor as a common base amplifier with its emitter connected to said readout electrode, its collector connected to said juncture point, and voltage supply means connected between said base electrode and ground, the potential of said voltage supply means being not greater than a predetermined level.

8. The improvement defined in claim 7 further including a diode, means connecting said diode between ground and a common electrode whereby the maximum potential appearing at said common electrode is the forward voltage drop of said diode.

References Cited by the Examiner

UNITED STATES PATENTS

| | | | |
|---|---|---|---|
| 2,685,025 | 7/54 | Root. | |
| 3,086,118 | 4/63 | Summerlin | 324—94 |

FOREIGN PATENTS

| | | |
|---|---|---|
| 566,021 | 11/58 | Canada. |

OTHER REFERENCES

Benetau: Article, Semiconductor Products, February 1961, The Design of High Stability D.C. Amplifiers, pages 27–30.

Lane et al.: "Current Integration With Solion Liquid Diodes," Electronics, Feb. 27, 1959, pages 53–55.

Lane et al.: "Characteristics and Applications of Four Solion Types," National Carbon Co., Division of Union Carbide Corp., March 1959, 33 page article.

Reich: Text, Functional Circuits and Oscillators, D. Van Nostrand Co., Inc., 1961, Differential-Amplifier Balance, page 7, FIGURE 5(*a*).

"Solion Principles of Electrochemistry and Low-Power Electrochemical Devices," U.S. Naval Ordnance Laboratory (1957), 45 page article.

ROY LAKE, *Primary Examiner.*

NATHAN KAUFMAN, *Examiner.*